United States Patent
Hossain et al.

(10) Patent No.: US 6,284,636 B1
(45) Date of Patent: Sep. 4, 2001

(54) TUNGSTEN GATE METHOD AND APPARATUS

(75) Inventors: Timothy Z. Hossain; Amiya R. Ghatak-Roy; Jason B. Zanotti, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/489,169

(22) Filed: Jan. 21, 2000

(51) Int. Cl.$^7$ .................. H01L 21/3205; H01L 21/4763

(52) U.S. Cl. .................. 438/592; 438/651; 438/655

(58) Field of Search .................. 438/302, 305, 438/592, 649, 651, 655, 659, 231, 304

(56) References Cited

U.S. PATENT DOCUMENTS

| | | | |
|---|---|---|---|
| 4,777,150 | * 10/1988 | Deneuville et al. | 438/659 |
| 5,034,791 | * 7/1991 | Kameyama et al. | 29/78 |
| 5,071,788 | 12/1991 | Joshi | 437/192 |
| 5,158,903 | * 10/1992 | Hori et al. | 438/302 |
| 5,223,455 | 6/1993 | Itoh et al. | 437/192 |
| 5,472,896 | * 12/1995 | Chen et al. | 438/305 |
| 5,492,734 | 2/1996 | Matsumoto et al. | 427/535 |
| 5,656,529 | 8/1997 | Fukase | 438/398 |
| 5,795,824 | 8/1998 | Hancock | 438/654 |
| 5,874,360 | 2/1999 | Wyborn et al. | 438/680 |
| 5,906,866 | 5/1999 | Webb | 427/534 |
| 6,037,263 | 3/2000 | Chang | 438/712 |
| 6,066,366 | 5/2000 | Berenbaum et al. | 427/250 |

FOREIGN PATENT DOCUMENTS

| | | | |
|---|---|---|---|
| 0068843 A2 | 1/1983 | (EP) | H01L/21/285 |
| 07263674 | 10/1995 | (EP) | H01L/29/78 |
| 2061615 A | 5/1981 | (GB) | H01L/29/62 |

OTHER PUBLICATIONS

Thomas E. Clark et al.; High Pressure Blanket CVD Tungsten—Materials Research Society; VLSI V.; pp. 167–177; Sep. 1989.

Ming L. Yu et al.; Surface reactions in the chemical vapor deposition of tungsten using $WF_6$ and $SiH_4$ on Al, PtSi, and TiN; vol. 67, No. 2; pp. 1055–1061; Jan. 1990.

Stanley Wolf and Richard N. Tauber; Silicon Processing for the VLSI Era, vol. 2—Process Integration; pp. 398–399; 1990.

E.J. McInerney et al.; The Rate Mechanisms of Silane Reduced CVD Tungsten—Materials Research Society; Conference Proceedings ULSI–VII; pp. 61–74; Oct. 1991.

Novellus Systems; Tungsten CVD Process Guide—Novellus; pp. 2:19–22; Dec. 1997.

D. L. Brors et al.; Properties of Low Pressure CVD Tungsten Silicide as Related to IC Process Requirements; Solid State Technology; pp. 183–186; Apr. 1983.

(List continued on next page.)

Primary Examiner—David Nelms
Assistant Examiner—Phuc T. Dang
(74) Attorney, Agent, or Firm—Timothy M. Honeycutt

(57) ABSTRACT

A tungsten gate electrode and method of fabricating the same are provided. In one aspect, a method of fabricating a gate electrode stack on a substrate is provided that includes forming an insulating film on the substrate and forming a conductor film on the insulating film by initially depositing a film of amorphous silicon and amorphous tungsten, and thereafter depositing a film of polycrystalline tungsten on the film and annealing the substrate to react the amorphous silicon with the amorphous tungsten to form tungsten silicide on the insulating film and to increase the grain structure of the polycrystalline tungsten film. The tungsten silicide film and the polycrystalline tungsten film are patterned to define the gate electrode stack. The method enables the seamless fabrication of an adhesion layer and a tungsten gate in a single chamber and without resort to titanium.

22 Claims, 3 Drawing Sheets

OTHER PUBLICATIONS

J. R. Creighton; Non–Selective Tungsten Chemical–Vapor Deposition Using Tungsten Hexacarbonyl; American Institute of Physics; pp. 192–201; 1988.

R. V. Joshi et al.; Mechanisms controlling temperature dependent mechanical and electrical behavior of $SiH_4$ reduced chemically vapor deposited W; Journal of Applied Physics; vol. 68; No. 11; pp. 5625–5629; Dec. 1990.

J. H. Sone et al.; Formation of low pressure chemically vapour dposited W thin film on silicon dioxide for gate electrode application; Thin Solid Films; vol. 253, No. 1/2; pp. 377–381; Dec. 1994.

K.Y. Ahn; New Development in CVD Tungsten Technology for Multilevel Interconnection; VLSI Multilevel Interconnection Conference, Fifth International IEEE; pp. 125–134; Jun. 13–14, 1998.

T. Tsutsumi et al.; A Selective LPCVD Tungsten Process Using Silane Reduction of VLSI Applications; IEEE Transactions on Electron Devices; pp. 569–576; Mar. 1990.

* cited by examiner

TUNGSTEN GATE METHOD AND APPARATUS

BACKGROUND OF THE INVENTION

1. Field of the Invention

This invention relates generally to semiconductor fabrication, and more particularly to a tungsten gate electrode and methods of fabricating the same.

2. Description of the Related Art

Aluminum and doped polycrystalline silicon have been widely used for decades as gate electrode materials in MOS circuit designs. Indeed some of the earliest MOS integrated circuits were implemented as p-channel enhancement mode devices using aluminum as the gate electrode material. Aluminum became an early material of choice due to its relatively low resistivity and material cost. Furthermore, there was already a large body of manufacturing experience with aluminum in the chip industry developed from bipolar integrated circuit processing.

A later process innovation that is still widely used today, involves the use of heavily doped polysilicon as a gate electrode material in place of or as a complement to aluminum. The switch to polysilicon as a gate electrode material stemmed from a recognition on the part of process engineers of certain limitations associated with aluminum in early fabrication technologies. In conventional semiconductor fabrication processing, aluminum must be deposited following completion of all high temperature process steps (including drive-in of the source and drain regions). As a result, an aluminum gate electrode must ordinarily be separately aligned to the source and drain. This alignment procedure can adversely affect both packing density and parasitic overlap capacitances between the gate and source/drain regions. In contrast, polysilicon with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

Despite the several advantages of polysilicon over aluminum as a gate electrode material, polysilicon has the disadvantage of a much higher resistivity as compared to aluminum. Higher resistivity translates into higher values of interconnect line resistance that can lead to undesirably long RC time constants and DC voltage variations within VLSI or ULSI circuits. The development of polycide films on top of polysilicon layers has alleviated some of the resistivity shortcomings of polysilicon gate electrodes. However, the resistivity of polysilicon gate electrodes in conventional MOS integrated circuit processing still presents a potential impediment to successful process scaling through reductions in the operating voltages of VLSI and ULSI devices.

Another disadvantage of polysilicon as a gate electrode material is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion.

Interest has recently turned to alternative materials, such as tungsten, for gate electrode design. The larger work function of tungsten produces low and nearly symmetrical threshold voltages for both PMOS and NMOS devices on moderately doped substrates. Accordingly, tungsten is attractive as a gate electrode material in CMOS circuit design. In addition, tungsten gate electrodes have the potential to exhibit reduced subthreshold leakage currents and decreased sensitivity to body bias as compared to conventional doped polysilicon gate electrodes. Finally, the resistivities of tungsten gate electrodes may be as much as 100 times or more lower than comparably sized doped polysilicon gates.

Despite the several advantages offered by tungsten as a gate electrode material, the integration of tungsten into semiconductor processing involves a number of significant challenges. In the conventional fabrication of a tungsten gate electrode stack, a gate oxide layer is formed on a doped silicon substrate by thermal oxidation or chemical vapor deposition ("CVD"). Thereafter, an adhesion or so-called "glue" layer is blanket deposited on the gate oxide layer. A tungsten film is next deposited on the glue layer. In many conventional processes, the tungsten film is deposited by the CVD reduction of $WF_6$ in a silane ambient. The deposition of a glue layer is a necessary predicate to CVD tungsten deposition due to the relatively poor adhesion of CVD tungsten to oxide. Thus, a glue layer composed of a material which exhibits acceptable adhesion to the underlying oxide and the later-deposited tungsten film is applied as a precursor to the tungsten CVD step.

Titanium nitride is a common material used for a glue layer, although other titanium based films, such as Ti:W have been used as well. The deposition of a titanium based adhesion film normally cannot be carried out in the same CVD chamber used to deposit the CVD tungsten film. Accordingly, the CVD glue layer and the CVD tungsten films involve separate deposition steps in separate chambers and the attendant movement of wafers between the two.

Another shortcoming of conventional tungsten gate electrode stack processing stems from the highly reactive character of titanium and the chemistry associated with CVD tungsten. As noted above, many conventional CVD tungsten deposition processes involve the reduction of $WF_6$ in silane. This reduction process liberates quantities of fluorine which may readily diffuse into the underlying titanium based adhesion film and react with the titanium therein. The incorporation of $TiF_X$ compounds into the adhesion layer may not only degrade the resistivity of the glue layer, but more significantly, may result in the ultimate delamination of the glue layer from the underlying oxide layer. This can produce not only undesirable device performance but also catastrophic device failure depending upon the extent of the delamination.

The present invention is directed to overcoming or reducing the effects of one or more of the foregoing disadvantages.

SUMMARY OF THE INVENTION

In accordance with one aspect of the present invention, a method of fabricating a circuit device is provided that includes forming an insulating film on a substrate and forming a film of amorphous silicon and amorphous tungsten on the insulating film. A film of polycrystalline tungsten is formed on the film of amorphous silicon and amorphous tungsten and the substrate is annealed to react the amorphous silicon with the amorphous tungsten to form tungsten silicide on the insulating film and to increase the grain structure of the polycrystalline tungsten film.

In accordance with another aspect of the present invention, a method of fabricating a gate electrode stack on a substrate is provided that includes forming an insulating film on the substrate and forming a conductor film on the insulating film by initially depositing a film of amorphous silicon and amorphous tungsten, and thereafter depositing a film of polycrystalline tungsten on the film and annealing the substrate to react the amorphous silicon with the amorphous tungsten to form tungsten silicide on the insulating film and to increase the grain structure of the polycrystalline tungsten film. The tungsten silicide film and the polycrystalline tungsten film are patterned to define the gate electrode stack.

In accordance with another aspect of the present invention, a circuit device is provided that includes a substrate, an insulating film on the substrate and a tungsten silicide film on the insulating film that has a sufficient amount of unbonded silicon to bond the tungsten silicide film to the insulating film. A tungsten film is positioned on the tungsten silicide film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
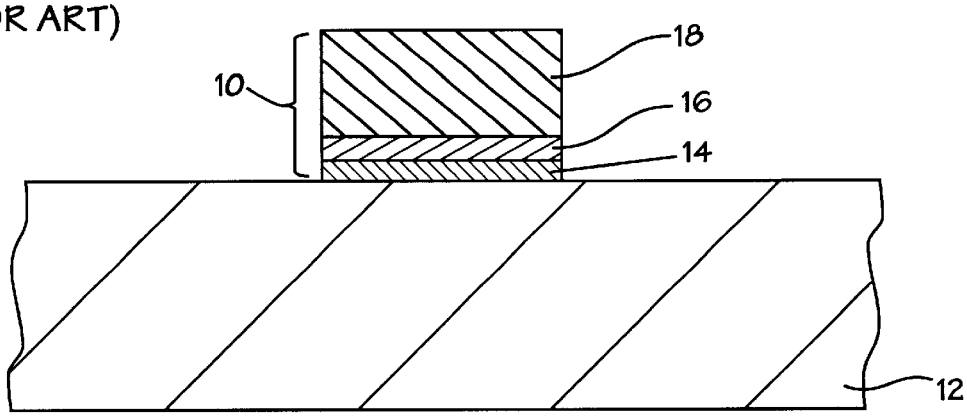
FIG. 1 is a cross-sectional view of an exemplary conventional tungsten gate electrode stack fabricated on a semiconductor substrate.

In the drawings described below, reference numerals are generally repeated where identical elements appear in more than one figure. Turning now to the drawings, and in particular to FIG. 1, therein is shown a cross-sectional view of an exemplary conventional tungsten gate electrode stack 10 fabricated on a semiconductor substrate 12. The gate electrode stack 10 is commonly used as a switching device for a field effect transistor the other components of which are not shown for simplicity of illustration. The stack 10 consists of a gate dielectric layer 14 positioned on the substrate 12, an adhesion or glue layer 16 formed on the gate dielectric layer 14 and a tungsten gate electrode 18 formed on the adhesion layer 16. The substrate 12 is composed of silicon while the gate dielectric layer 14 is composed of an oxide of silicon. The adhesion layer 16 is composed of a titanium-based material, such as TiN.

Figure 2:
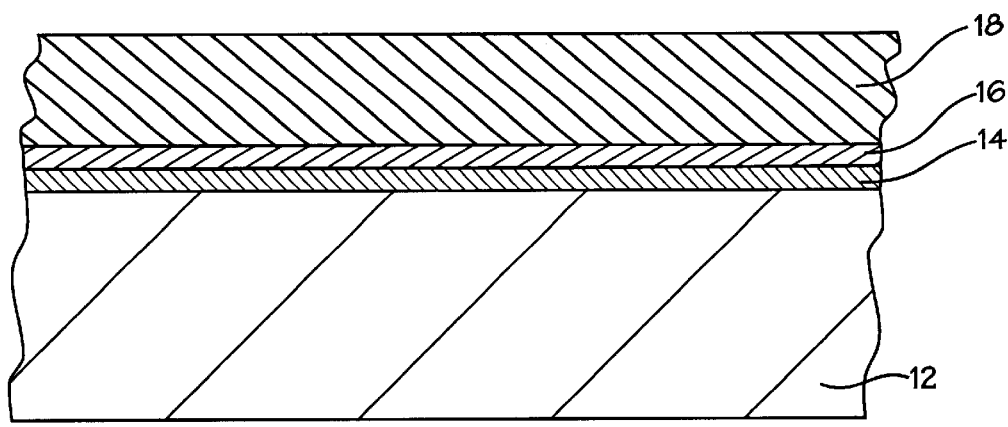
FIG. 2 is a cross-sectional view depicting the initial fabrication steps for the conventional gate electrode stack depicted in FIG. 1.

An exemplary conventional process flow for fabricating the gate electrode stack 10 may be understood by referring now to FIG. 2. The gate dielectric layer 14 is initially established on the silicon substrate 12 by thermal oxidation or chemical vapor deposition. Oxide has been and continues to be a principal material of choice for gate dielectric layers in transistor fabrication due to its acceptable electrically insulating properties and relative ease of fabrication. However, the relatively poor adhesion characteristics of CVD tungsten to oxide necessitates the fabrication of the adhesion layer 16 on the gate dielectric layer 14 prior to the deposition of the tungsten layer 18. In this regard, titanium or titanium nitride is deposited on the gate dielectric layer 14 by physical vapor deposition or CVD as the case may be. In theory, the titanium-based adhesion layer 16 will readily adhere to the underlying oxide layer 14, and the later deposited tungsten layer 18 will readily adhere to the titanium-based adhesion layer 16. In some conventional processes, the adhesion layer 16 is a laminate of an underlying titanium layer and an overlying titanium nitride layer.

Irrespective of the exact composition of the underlying adhesion layer 16, the tungsten electrode layer 18 is next deposited on the adhesion layer 16 in a CVD process involving the reduction of $WF_6$ gas in the presence of $SiH_4$ and $H_2$ gas. The reducing ambient is initially primarily silane. As the process progresses, the percentage of silane is reduced and the percentage of hydrogen is correspondingly increased to complete the reduction and deposition process. The result is the formation of a polycrystalline tungsten film 18 on the adhesion layer 16. As noted above, the difficulty with this conventional approach for fabricating a tungsten gate electrode stack is the propensity for the adhesion layer 16 to delaminate from the underlying gate dielectric layer 14 as a result of the formation of $TiF_X$ compounds in the adhesion layer 16. The formation of $TiF_X$ compounds is an unwanted byproduct of the diffusion of fluorine atoms from the $WF_6$ reduction process into the adhesion layer 16. The diffused fluorine atoms may readily react with the highly reactive titanium, which is present in the layer 16 as elemental titanium, as titanium nitride or both.

The tungsten film 18 is subsequently masked and anisotropically etched to yield the completed gate electrode stack 10 depicted in FIG. 1. The aforementioned delamination may result in unacceptably high resistivity for the gate electrode stack 10 or in catastrophic failure of the device associated with the gate electrode stack 10.

Figure 3:
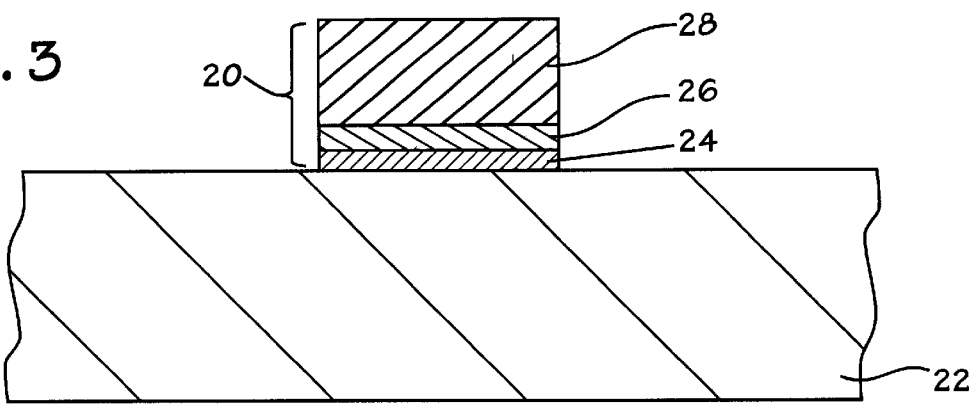
FIG. 3 is a cross-sectional view of an exemplary embodiment of a tungsten gate electrode stack fabricated on a semiconductor substrate in accordance with the present invention.

An exemplary embodiment of a tungsten gate electrode stack 20 fabricated in accordance with the present invention may be understood by referring now to FIG. 3 which is a cross-sectional view of the gate electrode stack 20 fabricated on a semiconductor substrate 22. The gate electrode stack 20 consists of a gate insulating layer 24 fabricated on the semiconductor substrate 22, a tungsten silicide adhesion layer 26 positioned on the gate insulating layer 24 and a tungsten gate electrode 28 positioned on the adhesion layer 26. The tungsten silicide adhesion layer 26 contains a sufficient amount of unbonded silicon atoms which adhere to the underlying gate insulating layer 24, and a majority concentration of tungsten silicide to which the overlying tungsten gate electrode 28 readily adheres.

Figure 4:
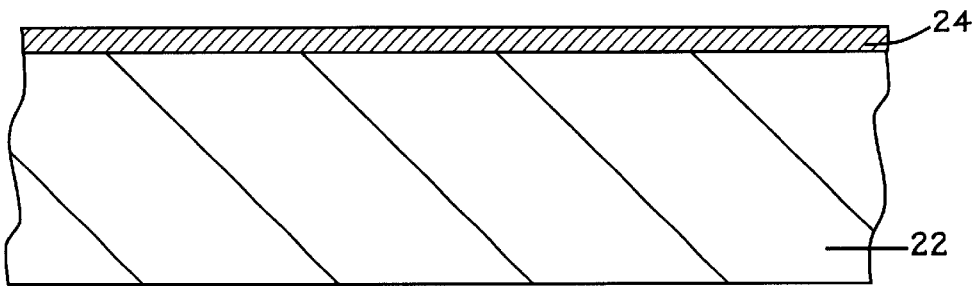
FIG. 4 is a cross-sectional view of the substrate depicted in FIG. 3 depicting the formation of a gate insulating layer thereon in accordance with the present invention.

An exemplary process flow for fabricating the gate electrode stack 20 in accordance with the present invention may be understood by referring now to FIGS. 4, 5, 6 and 7, and initially to FIG. 4. Initially, the gate insulating layer or film 24 is fabricated on the semiconductor substrate 22. The substrate 22 may be composed of p-doped silicon, n-doped silicon, silicon-on-insulator or other suitable substrate materials. The gate insulating film 24 may be composed of oxide, silicon nitride, laminates of these or other well known gate insulating film materials and may be fabricated by oxidation, CVD or other well known techniques. In an exemplary embodiment, the gate insulating layer 24 is composed of oxide with a thickness of about 10 to 200 Å and is fabricated by dry oxidation of the silicon substrate 22.

Figure 5:
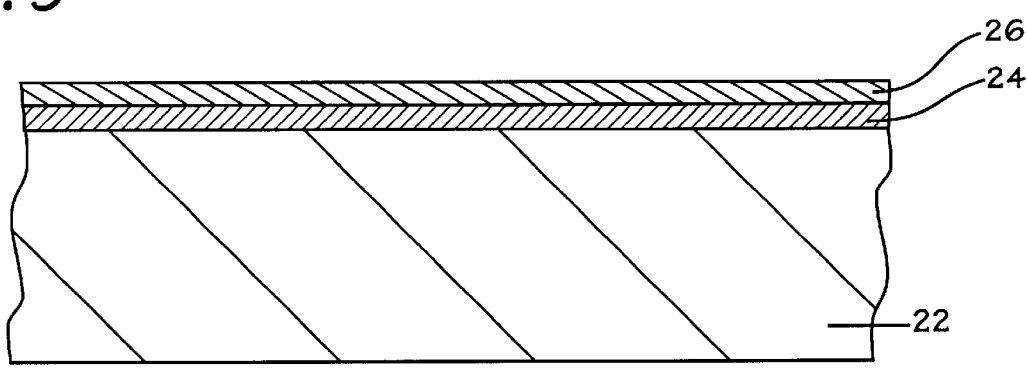
FIG. 5 is a cross-sectional view like FIG. 4 depicting the deposition of an adhesion layer in accordance with the present invention.
Figure 6:
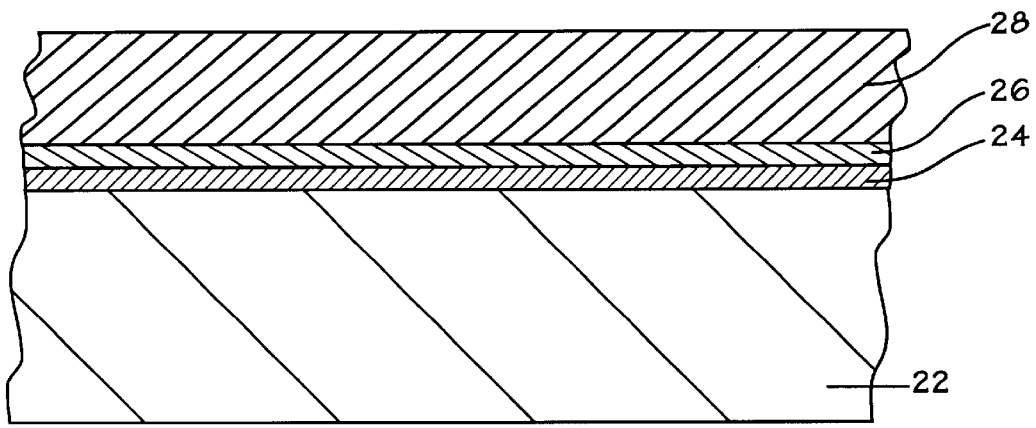
FIG. 6 is a cross-sectional view like FIG. 5 depicting the deposition of a tungsten film on the adhesion layer in accordance with the present invention.

The fabrication of the adhesion layer 26 and the tungsten layer 28 may be understood by referring now to FIGS. 5 and 6, which depict two stages of a CVD reduction of $WF_6$ in silane. Initially, and as depicted in FIG. 5, a mixture of $WF_6$ and $SiH_4$ is flowed over the gate insulating layer 24 for a relatively short period of time at a chamber temperature of about 300 to 400° C. and pressure of about 100 to 300 mtorr. The $SiH_4$-to-$WF_6$ ratio is kept high enough to produce a deposition of a combination of amorphous silicon ($\alpha$-Si) and amorphous tungsten ($\alpha$-W). The purpose of the high $SiH_4$-to-$WF_6$ ratio is to ensure that the deposition produces $\alpha$-Si and $\alpha$-W along with a sufficient amount of unbonded silicon atoms. It is desirable for silicon to be present in the film 26 in non-stoichiometric quantities relative to the tungsten so that a subsequently performed anneal to convert the $\alpha$-W to tungsten silicide does not consume all of the available $\alpha$-Si. The unbonded silicon remaining after the anneal will enable the film 26 to readily adhere to the underlying insulating film 24.

After the initial flow of high ratio $SiH_4$-to-$WF_6$, the flow of $SiH_4$ is greatly reduced while the flow of $WF_6$ is continued to produce the film 28 of polycrystalline tungsten as shown in FIG. 6. The polycrystalline structure will yield more favorable resistivity than a more amorphous grain structure. The film 28 will be deposited to a greater thickness than the $\alpha$-Si and $\alpha$-W film 26, although the thicknesses of both films 26 and 28 are largely matters of design discretion. In an exemplary embodiment, the tungsten film 28 will have a thickness that is approximately twenty times the thickness of the underlying adhesion layer 26.

The requisite flow periods for the high and low $SiH_4$-to-$WF_6$ ratio flows will depend in large part on the particular type of tool used, the desired thicknesses for the films 26 and 28 and the desired deposition rates. Experiment in an Applied Materials Endura tool set to yield deposition rates of between about 10 Å/s and 200 Å/s has shown that an initial flow of $SiH_4$ and $WF_6$ with a $SiH_4$-to-$WF_6$ ratio of greater that about 2:1 yields an $\alpha$-Si and $\alpha$-W film 26 with a sufficient amount of free silicon therein, and a subsequent flow of $SiH_4$ and $WF_6$ with a $SiH_4$-to-$WF_6$ ratio of less than about 1:2 yields a good quality polycrystalline tungsten film 28. For assumed thicknesses for the films 26 and 28 of 200 Å and 4000 Å respectively, and tool flow rates tuned to yield a deposition rate of about 10 Å/s, the 2:1 $SiH_4$-to-$WF_6$ ratio flow may be carried out for about 20 seconds and the 1:2 $SiH_4$-to-$WF_6$ ratio flow for about 400 seconds.

Figure 7:
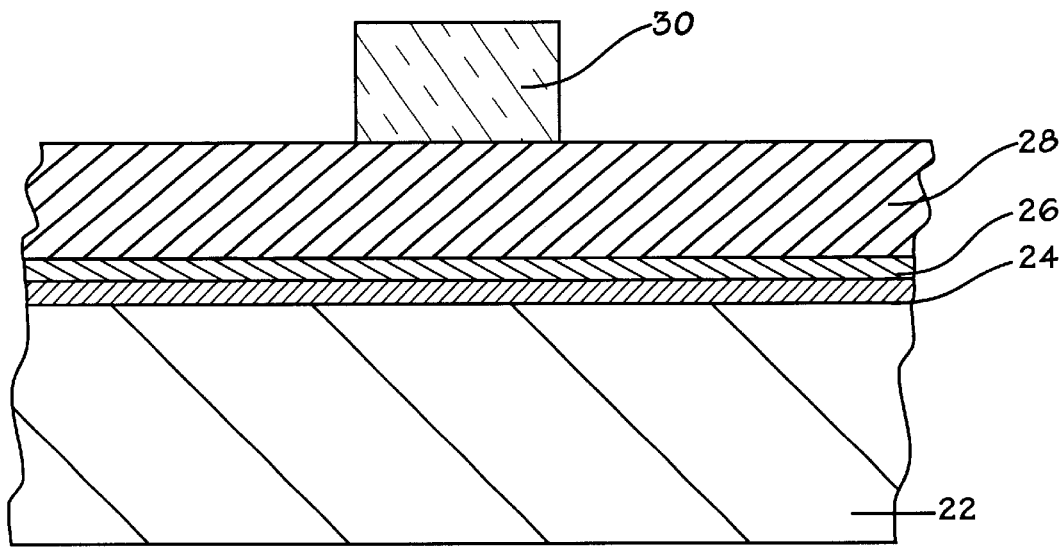
FIG. 7 is a cross-sectional view like FIG. 6 depicting the formation of a lithographic mask on the tungsten in accordance with the present invention.

Referring now to FIG. 7, a suitable lithographic mask 30 composed of well known resist or other masking materials is patterned, that is, exposed and developed to yield the desired shape of the later formed gate electrode stack 20 depicted in FIG. 3. The tungsten film 28, the underlying adhesion layer 26 and the gate insulating layer 24 are next anisotropically etched to yield the gate electrode stack 20 depicted in FIG. 3. The etch is advantageously a fluorinated plasma etch using, for example, $CF_4/O_2$ with argon as a diluent gas.

Referring again to FIG. 3, the substrate 22 is next annealed at about 500 to 1100° C. The anneal produces a chemical reaction between the $\alpha$-Si and the $\alpha$-W in the film 26 which produces tungsten silicide with the generic chemical formula $W_XSi_Y$, specific examples of which may be $W_5Si_3$ and $WSi_2$. Because the process of depositing the film 26 resulted in non-stoichiometric quantities of silicon and tungsten in the film 26, there will be excess and unbonded silicon atoms in the film 26 following the anneal which readily adhere the film 26 to the underlying oxide film 24. The anneal also increases the average grain size of the overlying polycrystalline tungsten electrode 28 which results in an improvement in the electrical resistivity thereof. The anneal may be performed for about 30 to 90 minutes in a furnace process or for about 5 to 75 seconds in a rapid thermal anneal process.

Optionally, the anneal may be performed prior to the patterning of the gate electrode stack 20. In this regard, the anneal may be performed on the blanket films 24, 26 and 28 depicted in FIG. 7 and the aforementioned anisotropic etch performed thereafter.

The process of the present invention eliminates titanium as an adhesion layer material, thus eliminating the potential for delamination due to titanium-fluorine reactions. In addition, the process of the present invention provides for the seamless production of a tungsten gate electrode and underlying adhesion layer by merely changing the ratio of $WF_6$ and silane flows into the CVD chamber. In this way, a separate process for establishing a titanium based adhesion layer, which ordinarily requires the use of a separate tool and workpiece movements for depositing both tungsten and titanium is eliminated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device, comprising:
   forming an insulating film of a substrate;
   forming a film of a combination of amorphous silicon and amorphous tungsten on the insulating film;
   forming a film of polycrystalline tungsten on the film of a combination of amorphous silicon and amorphous tungsten; and
   annealing the substrate to react the amorphous silicon with the amorphous tungsten to form tungsten silicide on the insulating film and to increase the grain structure of the polycrystalline tungsten film.

2. The method of claim 1, wherein the insulating film comprises oxide.

3. The method of claim 1, wherein the film of a combination of amorphous silicon and amorphous tungsten is deposited by exposing the insulating film to an ambient of $WF_6$ and $SiH_4$.

4. The method of claim 3, wherein the ratio of $SiH_4$ to $WF_6$ is greater than about 2.

5. The method of claim 3, wherein the film of polycrystalline tungsten is deposited by exposing the film of a combination of amorphous silicon and amorphous tungsten to an ambient of $WF_6$ and $SiH_4$ with a ratio of $SiH_4$ to $WF_6$ being low enough to deposit polycrystalline tungsten.

6. The method of claim 1, comprising patterning the films of tungsten silicide and polycrystalline tungsten into a preselected pattern.

7. A method of fabricating a gate electrode stack on a substrate, comprising:

forming an insulating film on the substrate;

forming a conductor film on the insulating film by initially depositing a film of a combination of amorphous silicon and amorphous tungsten, and thereafter depositing a film of polycrystalline tungsten on the film of a combination of amorphous silicon and amorphous tungsten and annealing the substrate to react the amorphous silicon with the amorphous tungsten to form tungsten silicide on the insulating film and to increase the grain structure of the polycrystalline tungsten film; and patterning the tungsten silicide film and the polycrystalline tungsten film to define the gate electrode stack.

8. The method of claim 7, wherein the insulating film comprises oxide.

9. The method of claim 7, wherein the film of a combination of amorphous silicon and amorphous tungsten is deposited by exposing the insulating film to an ambient of $WF_6$ and $SiH_4$.

10. The method of claim 9, wherein the ratio of $SiH_4$ to $WF_6$ is greater than about 2.

11. The method of claim 9, wherein the film of polycrystalline tungsten is deposited by exposing the film of a combination of amorphous silicon and amorphous tungsten to an ambient of $WF_6$ and $SiH_4$ with a ratio of $SiH_4$ to $WF_6$ being low enough to deposit polycrystalline tungsten.

12. The method of claim 7, wherein the patterning of the tungsten silicide film and the polycrystalline tungsten film is by anisotropic etching.

13. A circuit device, comprising:

a substrate;

an insulating film on the substrate;

a tungsten silicide film on the insulating film and having a sufficient amount of unbonded silicon to bond the tungsten silicide film to the insulating film; and a polycrystalline tungsten film on the tungsten silicide film.

14. The circuit device of claim 13, wherein the insulating film comprises oxide.

15. The circuit device of claim 13, wherein the tungsten silicide comprises $W_5Si_3$ and $WSi_2$.

16. The circuit device of claim 13, wherein the tungsten silicide film and the tungsten film comprise a gate electrode.

17. The circuit device of claim 16, wherein the insulating film is patterned with substantially the same lateral dimensions as the gate electrode.

18. A method of fabricating a circuit device, comprising:

forming an insulating film on a substrate;

forming a film of amorphous silicon and amorphous tungsten on the insulating film by exposing the insulating film to an ambient of $WF_6$ and $SiH_4$;

forming a film of polycrystalline tungsten on the film of amorphous silicon and amorphous tungsten; and annealing the substrate to react the amorphous silicon with the amorphous tungsten to form tungsten silicide on the insulating film and to increase the grain structure of the polycrystalline tungsten film.

19. The method of claim 18, wherein the insulating film comprises oxide.

20. The method of claim 18, wherein the ratio of $SiH_4$ to $WF_6$ is greater than about 2.

21. The method of claim 18, wherein the film of polycrystalline tungsten is deposited by exposing the film of amorphous silicon and amorphous tungsten to an ambient of $WF_6$ and $SiH_4$ with a ratio of $SiH_4$ to $WF_6$ being low enough to deposit polycrystalline tungsten.

22. The method of claim 18, comprising patterning the films of tungsten silicide and polycrystalline tungsten into a preselected pattern.

* * * * *